(12) United States Patent
Lin et al.

(10) Patent No.: US 9,058,849 B2
(45) Date of Patent: Jun. 16, 2015

(54) ELECTRONIC DEVICE WITH HARD DISK FRAME

(71) Applicant: HON HAI PRECISION INDUSTRY CO., LTD., New Taipei (TW)

(72) Inventors: Shih-Wei Lin, New Taipei (TW); Jiunn-Her Li, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/478,951

(22) Filed: Sep. 5, 2014

(65) Prior Publication Data

US 2015/0116864 A1    Apr. 30, 2015

(30) Foreign Application Priority Data

Oct. 30, 2013    (TW) .............................. 102139234 A

(51) Int. Cl.
*G11B 17/00*    (2006.01)
*G11B 33/12*    (2006.01)
*G11B 33/14*    (2006.01)
*H05K 7/14*    (2006.01)

(52) U.S. Cl.
CPC ............ *G11B 33/124* (2013.01); *G11B 33/142* (2013.01); *H05K 7/1401* (2013.01)

(58) Field of Classification Search
CPC .................................. G11B 17/00; G06F 1/16
USPC ............................ 360/99.15; 361/685, 679.33
See application file for complete search history.

(56) References Cited

U.S. PATENT DOCUMENTS

| | | | |
|---|---|---|---|
| 7,609,508 B2* | 10/2009 | Chen et al. ................ | 361/679.33 |
| 7,701,702 B2* | 4/2010 | Chen et al. ................ | 361/679.33 |
| 8,070,125 B2* | 12/2011 | Sun ................................ | 248/560 |
| 8,908,327 B1* | 12/2014 | Li ................................. | 360/99.17 |
| 2005/0141189 A1* | 6/2005 | Chen et al. ...................... | 361/685 |
| 2006/0002076 A1* | 1/2006 | Albrecht et al. ............... | 361/685 |
| 2008/0128579 A1* | 6/2008 | Chen et al. ...................... | 248/694 |
| 2008/0137280 A1* | 6/2008 | Chen et al. ...................... | 361/685 |
| 2009/0031334 A1* | 1/2009 | Goodman et al. ............. | 720/692 |
| 2012/0050980 A1* | 3/2012 | Zhang ........................ | 361/679.33 |
| 2013/0033813 A1* | 2/2013 | Ling et al. ................. | 361/679.34 |
| 2013/0070413 A1* | 3/2013 | Zhou ........................ | 361/679.33 |
| 2014/0118921 A1* | 5/2014 | Lin ........................... | 361/679.33 |

FOREIGN PATENT DOCUMENTS

CN    200820044057.1    12/2008

* cited by examiner

*Primary Examiner* — Allen T Cao
(74) *Attorney, Agent, or Firm* — Novak Druce Connolly Bove + Quigg LLP

(57) ABSTRACT

A hard disk frame for holding a hard disk drive can include a supporting plate defining a first opening, a first group of positioning portions and a second group of positioning portions. Each of the first and second group of the positioning portions can define a second opening. The second openings can communicate with the first opening. The first group of the positioning portions can enable the hard disk drive to be mounted to the supporting plate at a first direction, and a second group of the positioning portions can enable the hard disk drive to be mounted to the supporting plate in a second orientation different from the first direction. As a result, the hard disk can be arranged in the hard disk frame at different orientations.

20 Claims, 14 Drawing Sheets

ELECTRONIC DEVICE WITH HARD DISK FRAME

FIELD

The present disclosure generally relates to electronic devices, and more particularly to an electronic device with a hard disk frame.

BACKGROUND

Hard disk drives are generally used to store data in a notebook or a computer. The notebook or the computer can include a hard disk frame to secure the hard disk drive. However, when the typical hard disk frame is fixed on the notebook or the computer, an orientation of the typical hard disk frame is unchangeable, therefore, the hard driver can only be located at one orientation and cannot be changed to other orientations when the hard driver is assembled to the hard disk frame. Furthermore, the size of the typical hard disk frame is also unchangeable, therefore, one typical hard disk frame cannot accommodate with different sizes of the hard disk drives.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
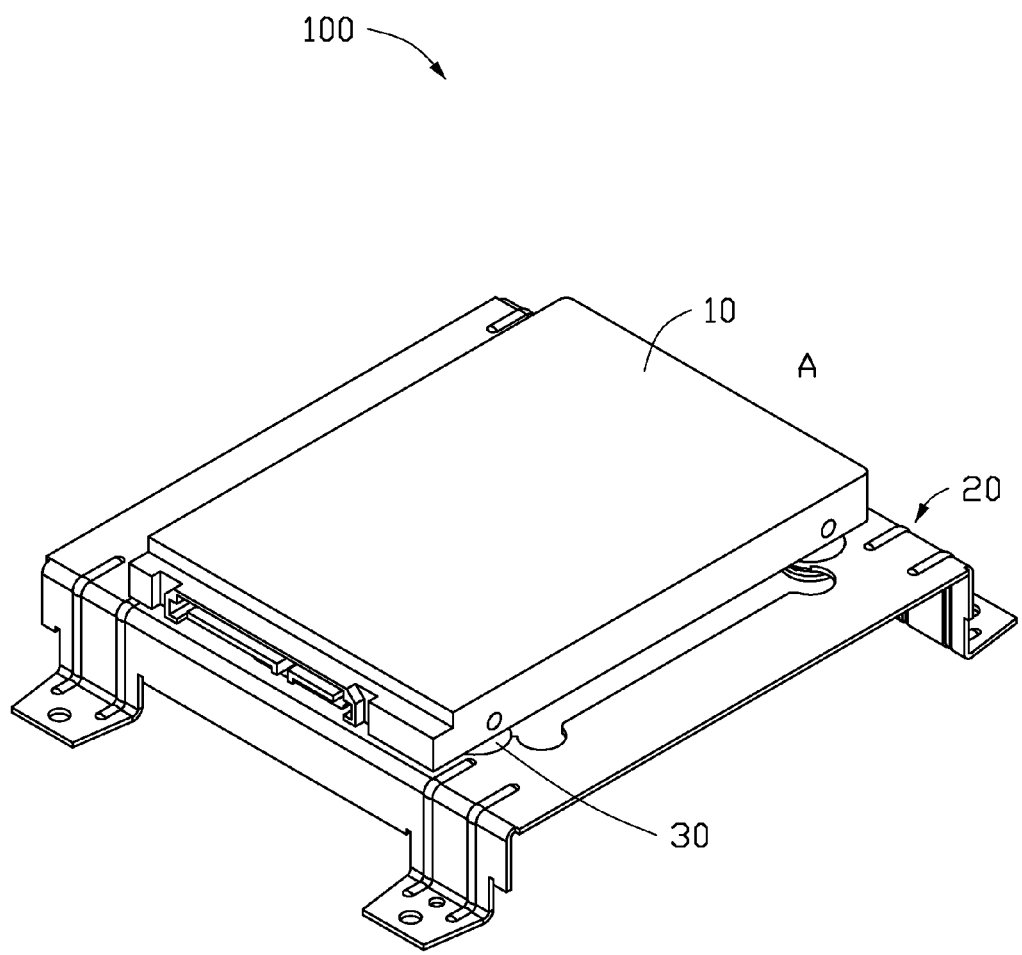
FIG. 1 is a first isometric view of an electronic device.

The present disclosure is illustrated by way of example and not by way of limitation in the figures of the accompanying drawings in that like reference numerals indicate similar elements. It should be noted that references to "an" or "one" embodiment in this disclosure are not necessarily to the same embodiment, and such references can mean "at least one."

Figure 2:
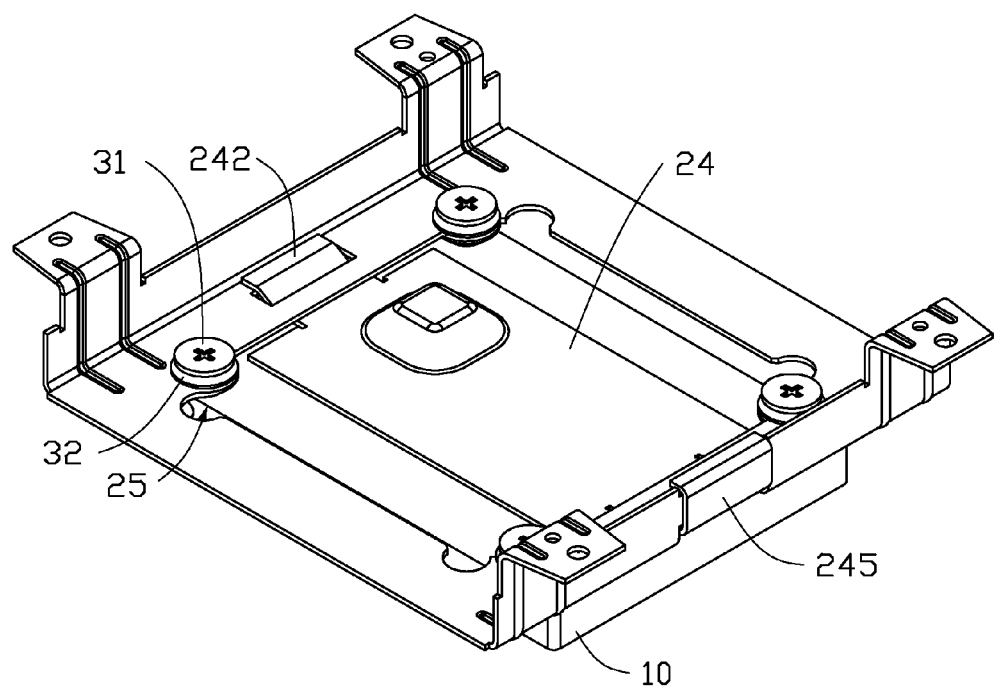
FIG. 2 is an isometric view of the electronic device of FIG. 1 viewed from another angle.

FIGS. 1 and 2 illustrate a first embodiment of an electronic device 100. The electronic device 100 can include a hard disk drive 10, a hard disk frame 20 supporting the hard disk drive 10, and a connecting element 30 connected to the hard disk drive 10 and the hard disk frame 20.

Figure 3:
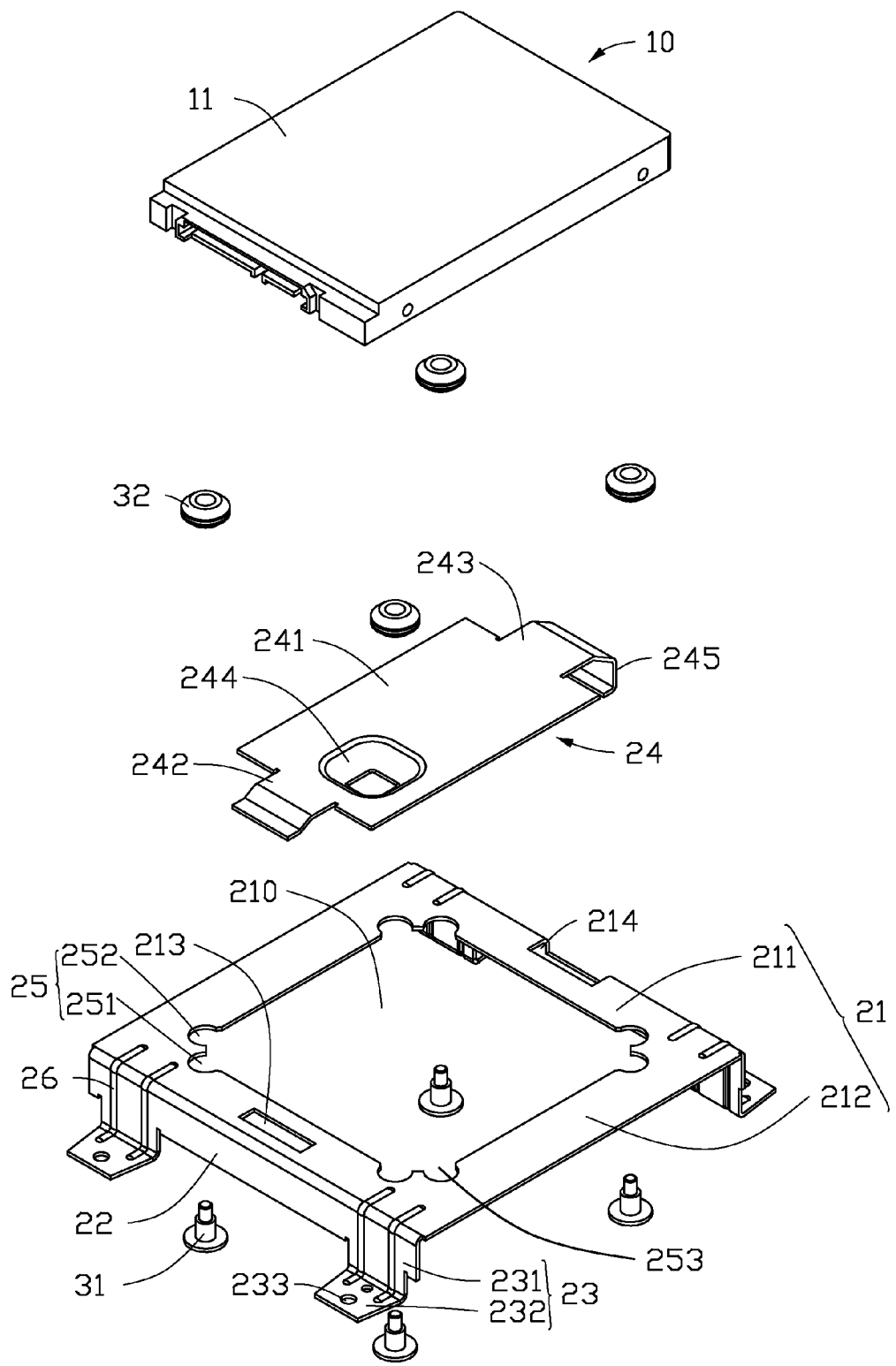
FIG. 3 is an exploded view of the electronic device of FIG. 1.
Figure 4:
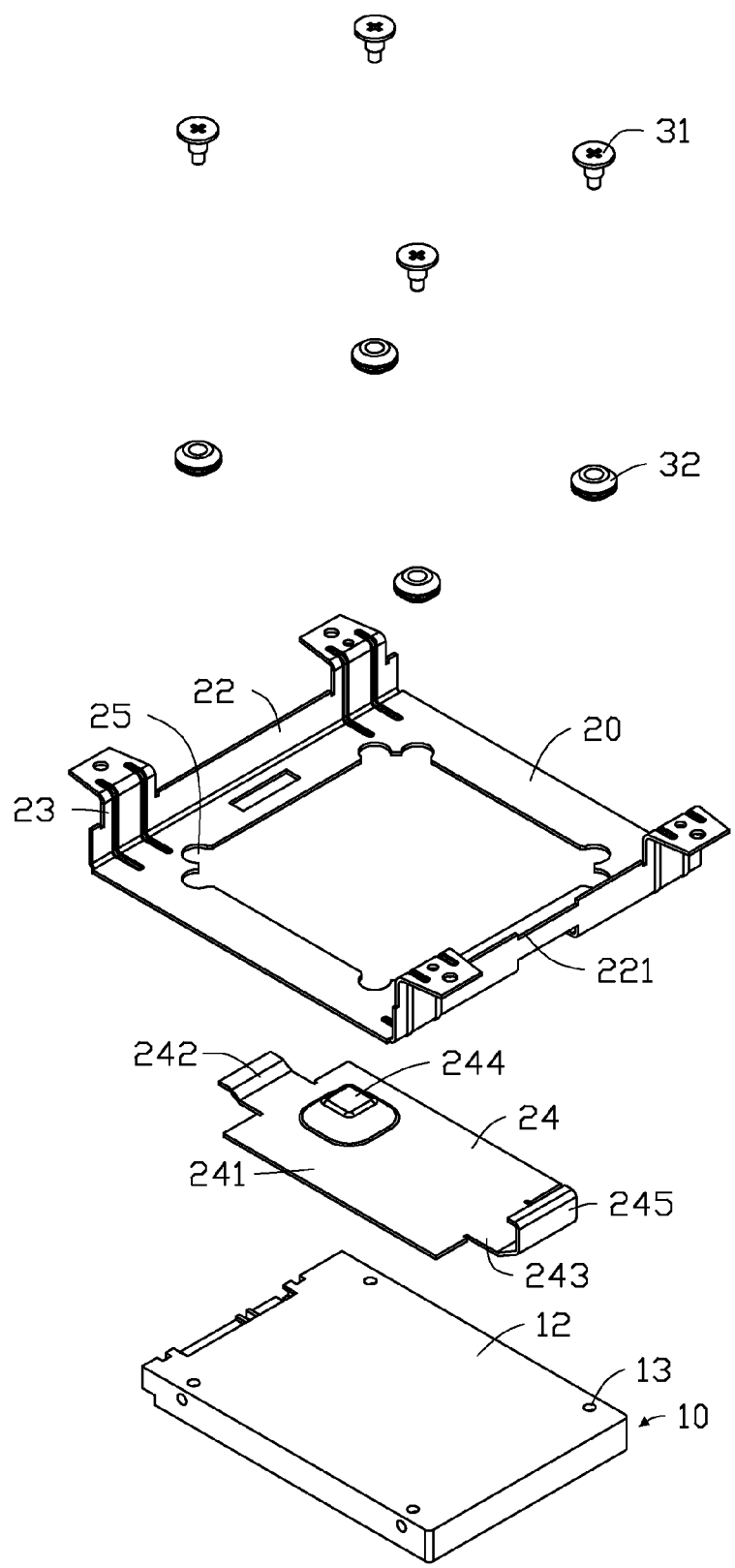
FIG. 4 is an exploded view of the electronic device of FIG. 3 viewed from another angle.

FIGS. 3 and 4 illustrate that the hard disk drive 10 can be cubic. The hard disk drive 10 can include a smooth first surface 11, and a second surface 12 opposite to the first surface 11. Each corner of the second surface 12 can define a position hole 13 used for fixation to the hard disk frame 20. In the illustrated embodiment, a size of the hard disk drive 10 can be 2.5 inches but not limited to 2.5 inches.

The hard disk frame 20 can include a supporting plate 21 which can be a rectangular board, a pair of sidewalls 22 extending from the supporting plate 21 and opposite to each other, a plurality of supporting legs 23 supporting the supporting plate 21, and an accessory 24 connecting to the supporting plate 21.

Figure 7:
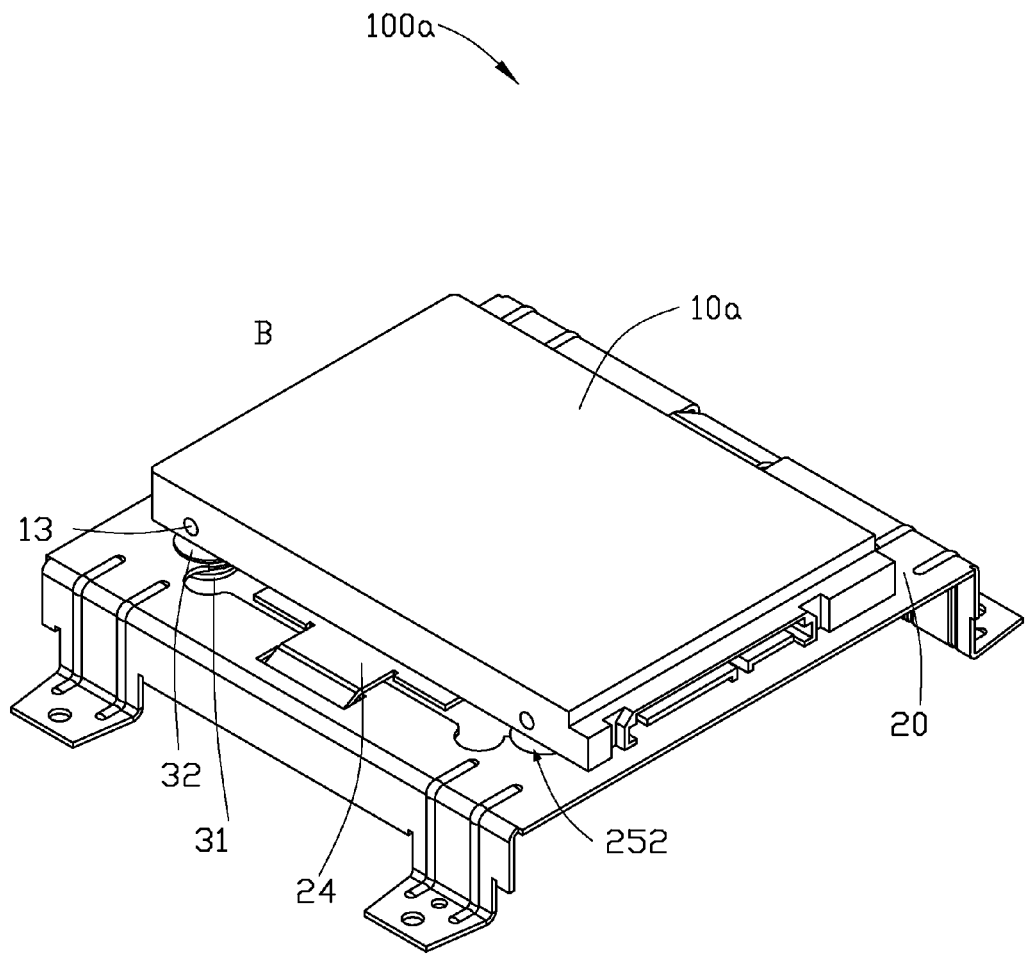
FIG. 7 is a second isometric view of the electronic device of FIG. 1 viewed from another angle.

The supporting plate 21 can define a first opening 210. That is, the supporting plate 21 can be a rectangular and hollow frame defining a rectangular space. The supporting plate 21 can include a pair of first side panels 211 opposite to each other and a pair of second side panels 212 vertical to the first side panels 211. The first side panels 211 and the second side panels 212 can be located end-to-end to form the first opening 210. The first side panels 211 and the second side panels 212 can be integrated. The length of the second side panels 212 can be greater than the first side panels 211. A plurality of positioning portions 25 can be located on four corners of an inner edge of the supporting plate 21. The positioning portions 25 can include a first group of positioning portions 251 and a second group of positioning portions 252. Each of the first and the second groups of the positioning portions 25 can define a second opening 253, the second opening 253 can communicate with the first opening 210. The first group of the positioning portions 251 can correspond to the position holes 13 when the hard disk drive 10 is placed in a first direction A (See FIG. 1). The second group of the positioning portions 252 can correspond to the position holes 13 when the hard disk drive 10 is placed in a second direction B different from the first direction A (See FIG. 7). A first latching hole 213 can be defined on one of the first side panels 211, and a second latching hole 214 can be defined on the other one of the first side panels 211. The first latching hole 213 and the second latching hole 214 can be used to latch with the accessory 24.

In the illustrated embodiment, the number of the sidewalls 22 can be two and the two sidewalls 22 can be opposite to each other. The sidewalls 22 can extend perpendicularly downward from outer edges of the first side panels 211. The sidewalls 22 and the supporting plate 21 can be integrated. In other embodiments, the number of the sidewalls 22 can be four and the sidewalls 22 can extend perpendicularly downward from the outer edges of the first side panels 211 and the second side panels 212.

In the illustrated embodiment, the number of the supporting legs 23 can be four. The supporting legs 23 can extend from outer edges of the supporting plate 21 and can be located at opposite side of each side wall 22. A fixing hole 233 can be defined on the fixing portion 232 and can be used to fix the hard disk drive 10 and the hard disk frame 20 together and to a cover (not shown) of the electronic device 100 through a fastener (not shown), such as screws.

The hard disk frame 20 further can include a plurality of ribs 26. In the illustrated embodiment, two ribs 26 can be located at each of the four corners of the hard disk frame 20. In detail, the ribs 26 can respectively extend from the first side panel 211 to the supporting leg 23 increasing stability of the hard disk frame 20.

The connecting element 30 can include a plurality of screws 31, and a plurality of buffering elements 32 corresponding to the screws 31. The first group of the positioning portions 251 can be engaged with the connecting element 30 to enable the supporting plate 21 to hold the hard disk drive 10 in a first direction A (see FIG. 1). The second group of the positioning portions 252 can be engaged with the connecting element 30 enabling the supporting plate 21 to hold the hard disk drive 10 in a second direction B (see FIG. 7) different from the first direction A.

FIGS. 3-4 illustrate that the accessory 24 can include a main body 241, a protruding portion 242 extending from one end of the main body 241 and a latching portion 243 extending from the other end of the main body 241. The protruding portion 242 and the latching portion 243 can be arranged on opposite sides of the main body 241. In detail, the main body 241 can be a rectangular piece. The length of the main body 241 can be smaller than the rectangular space of the supporting plate 21. A radiating portion 244 can be concave from the center of the main body 241. The radiating portion 244 can be used to contact heat generating elements (not shown) of the electronic device 100 for dissipating the heat generated by the heat generating elements. The protruding portion 242 can extend outward from one side of the main body 241 and an end of the protruding portion 242 can be bent downward. The latching portion 243 can extend outward from another side of the main body 241 and an end away from the main body 241 can form a hook 245. The latching portion 243 and the hook 245 can be in "J" shape. In this embodiment, the accessory 24 can be made of aluminum. In other embodiments, the accessory 24 can be made of copper. In other embodiments, the accessory 24 can be omitted.

Figure 5:
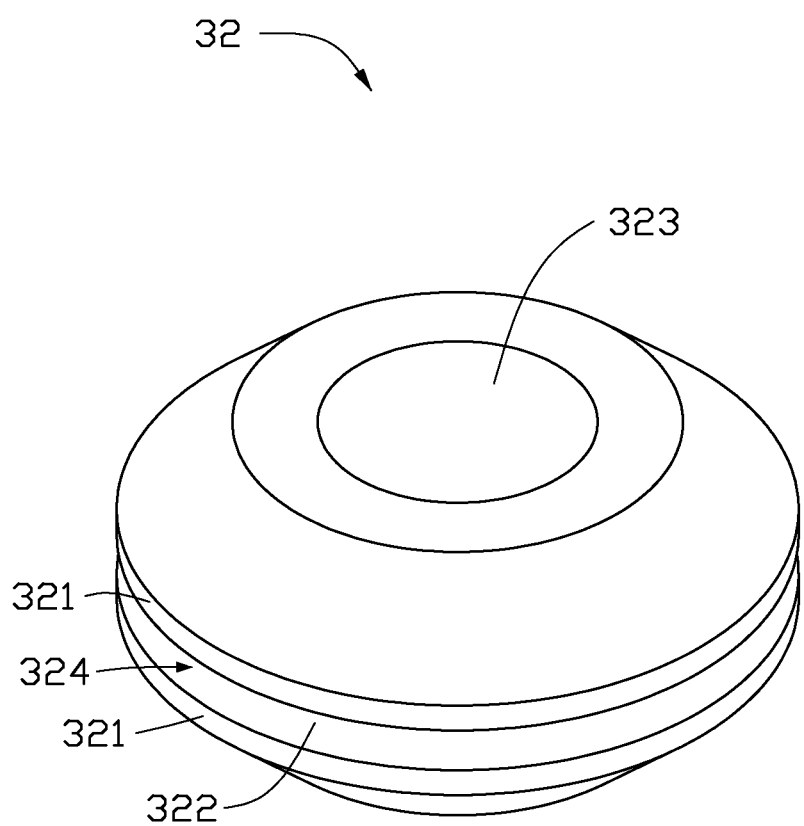
FIG. 5 is an isometric view of the buffering element of the electronic device of FIG. 1.
Figure 6:
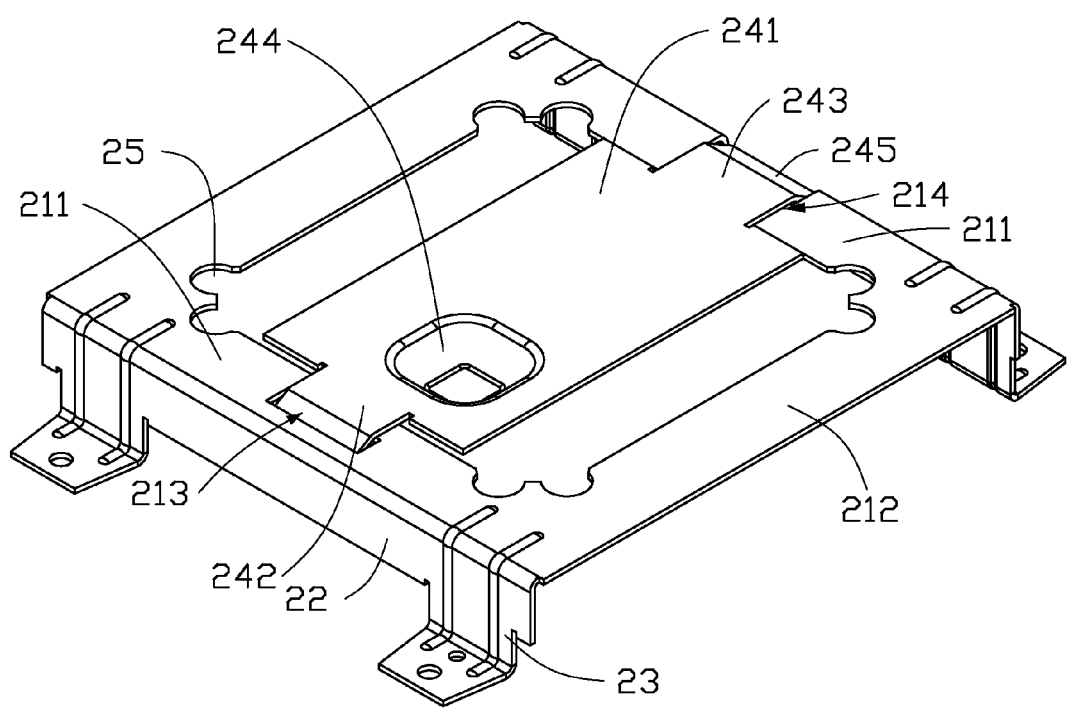
FIG. 6 is an isometric view of a hard disk frame of the electronic device.

FIG. 5 illustrates that the buffering element 32 can include two buffering pads 321, and a pillar 322 connecting to the buffering pads 321. A hole 323 can pass through the buffering pads 321 and the pillar 322.

FIGS. 2-7 illustrates that in assembly, first, the accessory 24 can be fixed to the hard disk frame 20. In detail, an end of the protruding portion 242 can be passed through the first latching hole 213 and can be held by the first side panel 211 defining the latching hole 213. The hook 245 can be inserted into the second latching hole 214 and can clasp the first side panel 211 defining the second latch hole 214. As a result, a top surface of the accessory 24 can be coplanar with a top surface of the supporting plate 21.

Second, the pillar 322 of the buffering element 32 can be inserted into the position hole 13 of the hard disk drive 10. Third, the hard disk drive 10 can be fixed to the hard disk frame 20. In detail, when the hard disk drive 10 is secured to the hard disk frame 20 along a first direction A (see FIG. 1). The buffering element 32 can be latched with the first group of positioning portions 251, then the screw 31 can be passed through the hole 323 in that order and can engage with the hard disk drive 10, such that the hard disk drive 10 can be fixed to the hard disk frame 20 in the first direction A. When the hard disk drive 10 is secured to the hard disk frame 20 along a second direction B (see FIG. 7). The buffering element 32 can be latched with the second group of the positioning portions 252, then the screw 31 can be passed through the hole (not shown) in that order and can engage with the hard disk drive 10a, such that the hard disk drive 10a can be fixed to the hard disk frame 20 in the second direction B.

Figure 8:
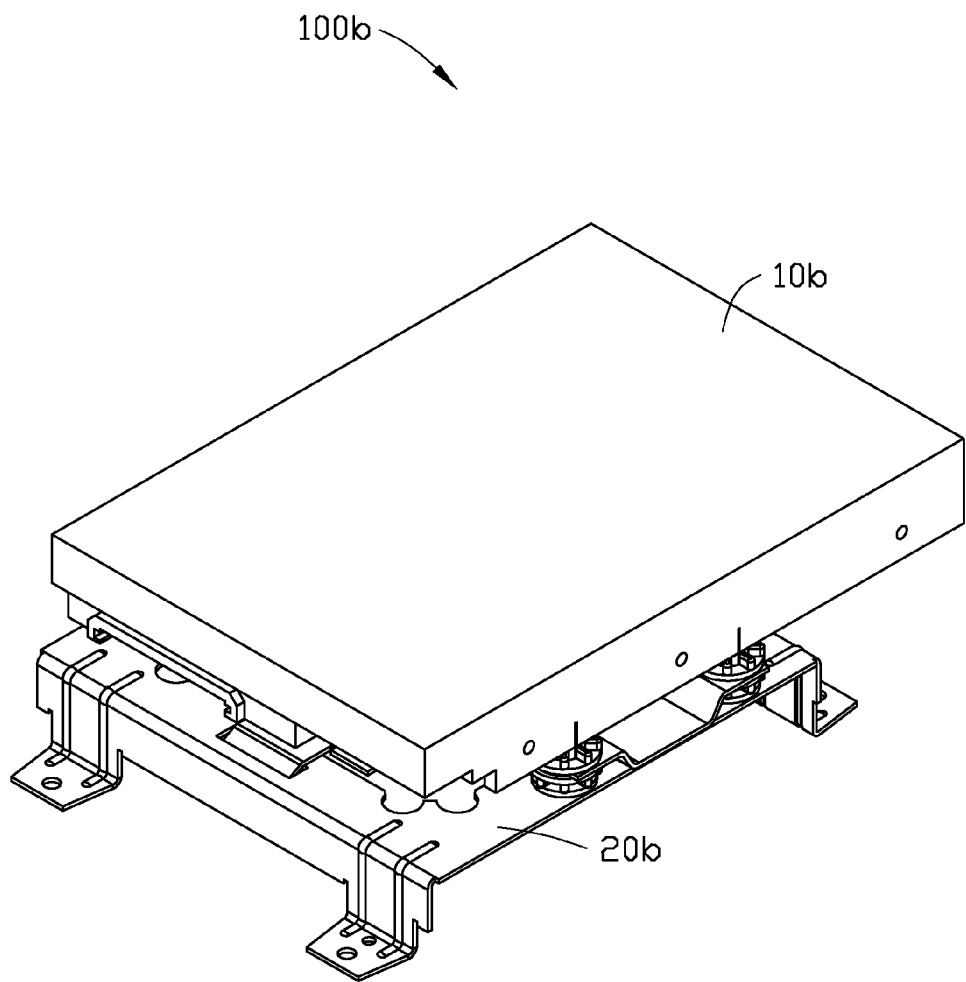
FIG. 8 is a third isometric view of the electronic device of FIG. 1 viewed from another angle.
Figure 9:
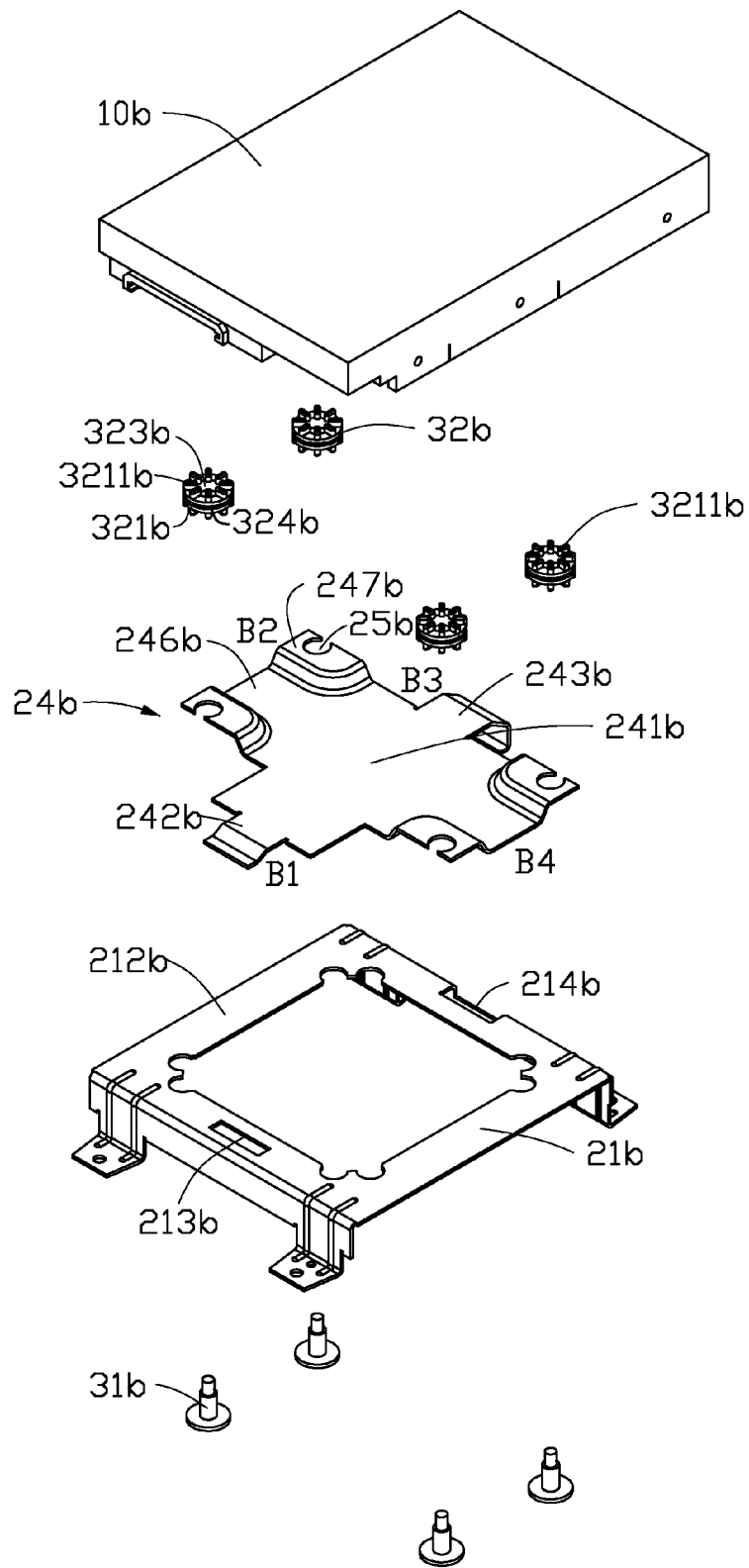
FIG. 9 is an exploded view of the electronic device of FIG. 8.
Figure 10:
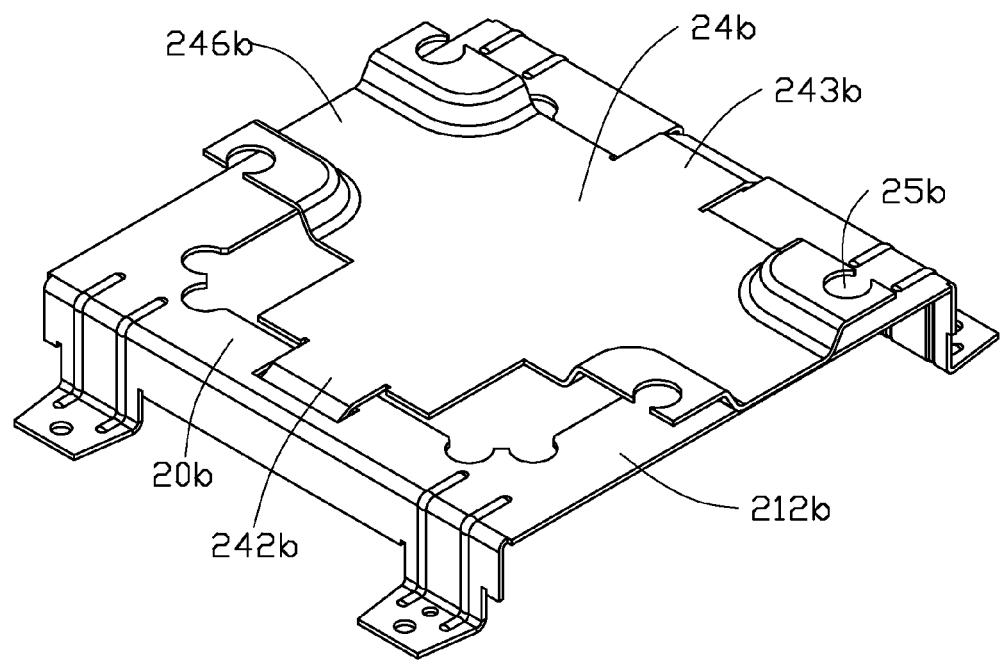
FIG. 10 is an isometric view of a hard disk frame of the electronic device of FIG. 8.
Figure 11:
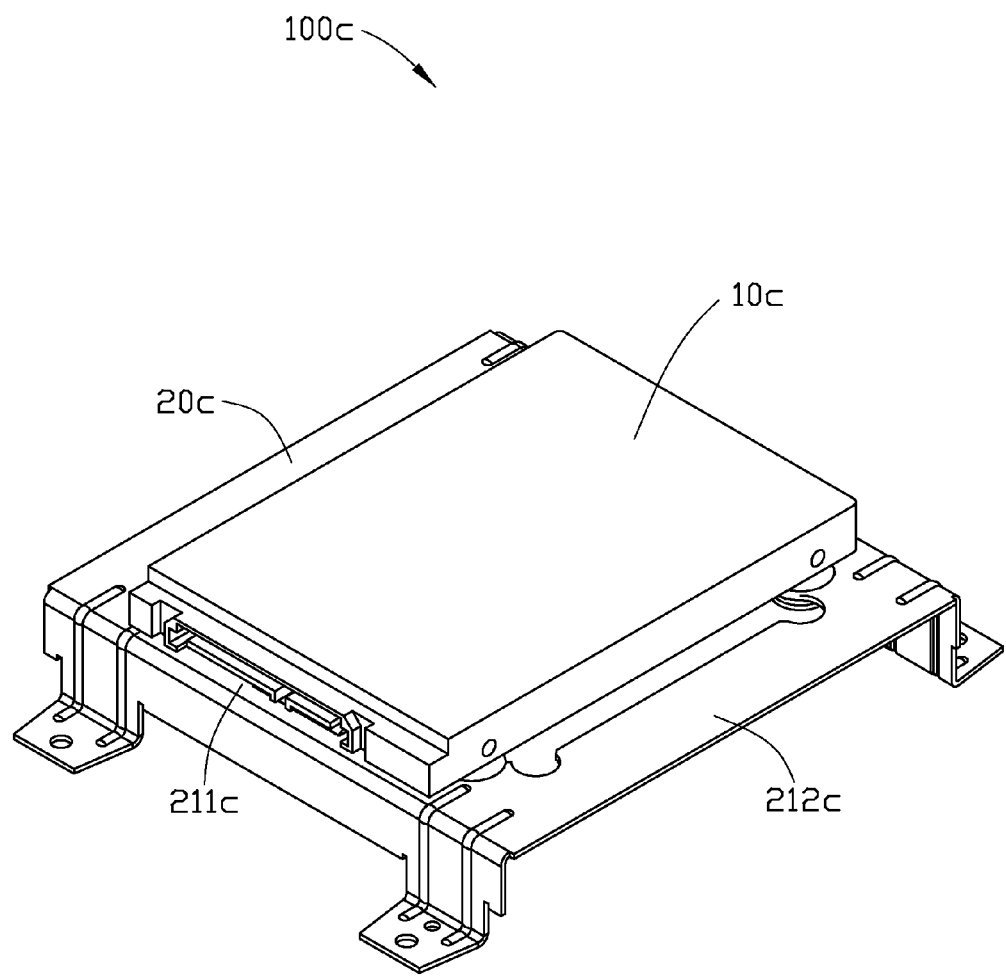
FIG. 11 is a forth isometric view of the electronic device of FIG. 1 viewed from another angle.
Figure 12:
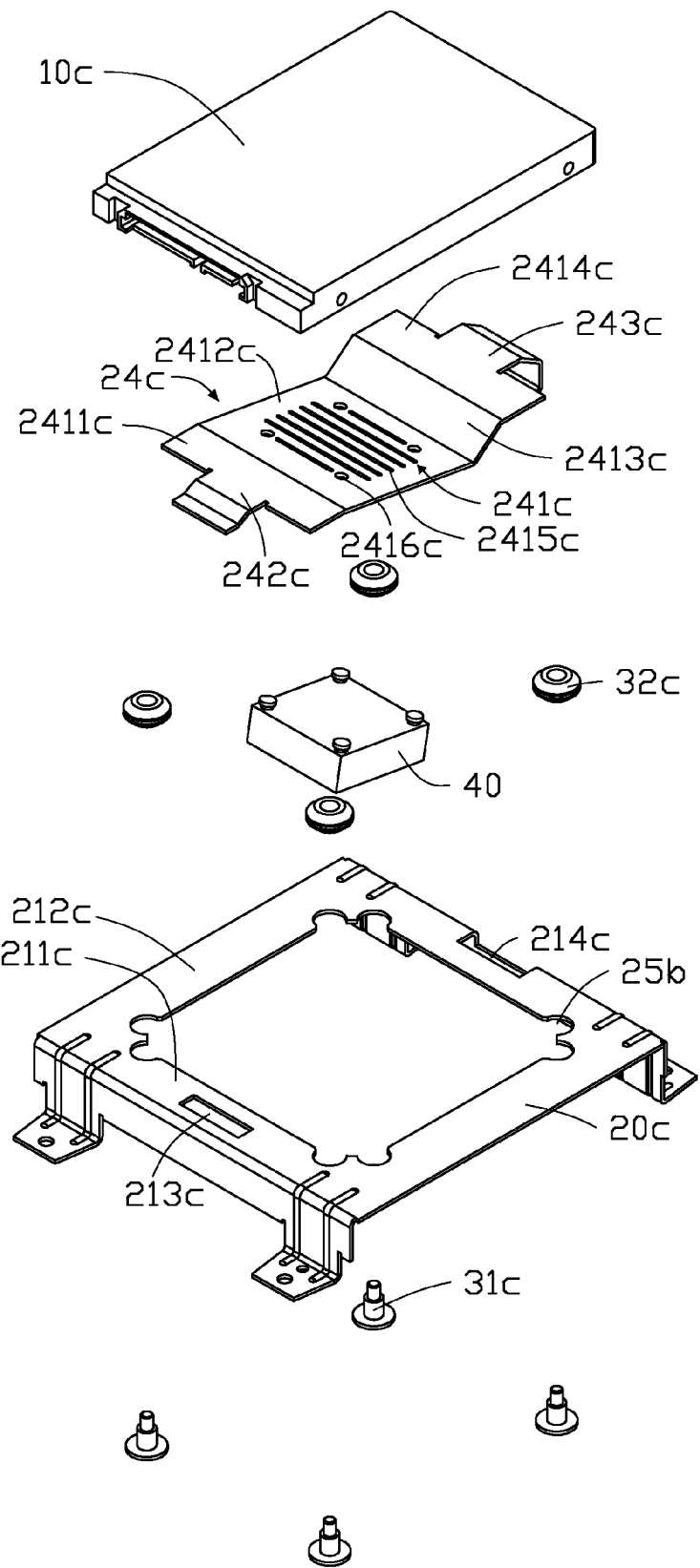
FIG. 12 is an exploded view of the electronic device of FIG. 11.
Figure 13:
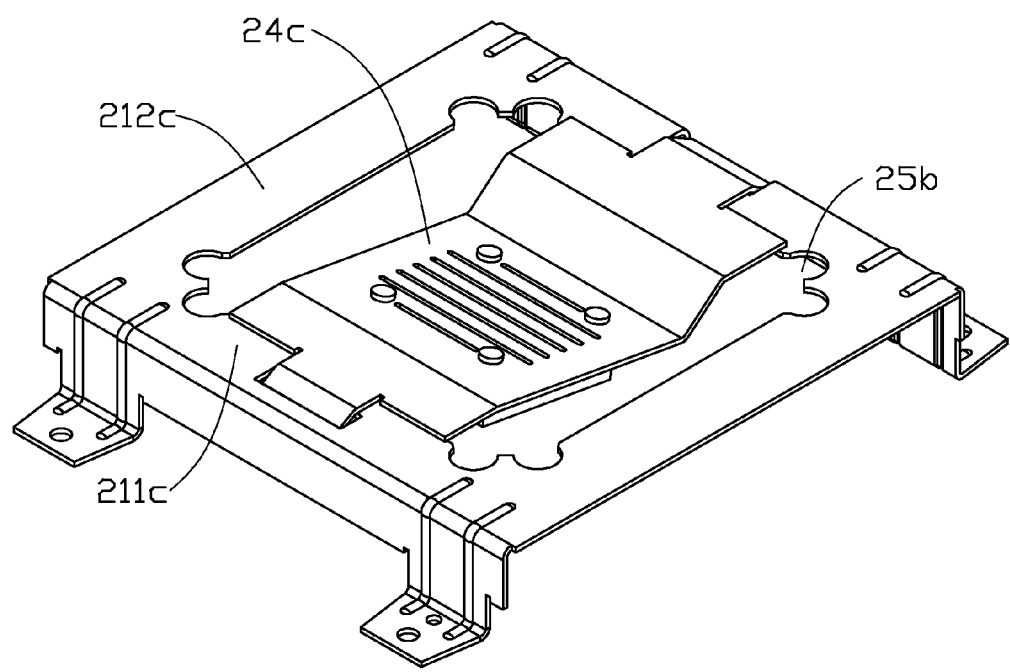
FIG. 13 is a first isometric view of the hard disk frame of FIG. 11.

FIGS. 8-10 illustrate a second embodiment of an electronic device 100b. The structure of the electronic device 100b is similar to the electronic device 100, the difference is a size of a hard disk drive 10b can be 3.5 inches, structure of an accessory 24b, structure of a buffering element 32b and a position hole (not shown) of the hard disk drive 10b can be located on a center of the bottom surface of the hard disk drive 10b.

The accessory 24b of the hard disk frame 20b can include a main body 241b, a protruding portion 242b can extend outwardly from a first end B1 of the main body 241b. A latching portion 243b can extend outwardly from a second end B2 of the main body 241b and two installing portions 246b can extend outwardly from a third end B3 and a fourth end B4 of the main body 241b.

A plurality of convex closures 247b can extend upwardly from two ends of each installing portion 246b. Each convex closures 247b can define a third group of positioning portions 25b and the positioning portions 25b of the installing portions 246b can be opposite to each other.

A plurality of convex blocks 3211b can be defined on the two buffering pads 321b of each buffering element 32b. The convex blocks 3211b can be spaced from each other and can be arranged to increase stability of the hard disk drive 10b.

In assembly, first, the accessory 24b can be fixed to the hard disk frame 20. In detail, an end of the protruding portion 242b can be passed through the first latching hole 213b and can be held by the supporting plate 21b defining the latching hole 213b. The latching portion 243b can be inserted into the second latching hole 214b and can clasp the supporting plate 21b defining the second latch hole 214b. Second, the buffering element 32b can be inserted into the position hole of the hard disk drive 10b. Third, the hard disk drive 10b can be fixed to the accessory 24b. In detail, the buffering element 32b can be latched with the positioning portions 25b of the accessory 24b, then the screw 31b can be passed through the hole 323b in that order and can engage with the hard disk drive 10b, such that the hard disk drive 10b can be fixed to the accessory 24b.

FIGS. 11-14 illustrate a third embodiment of an electronic device 100c. The structure of the electronic device 100c is similar to the electronic device 100, the difference of which is a structure of an accessory 24c and an addition of a fan 40. The accessory 24c can include an installing board 2412c, a first board 2411c can extend downward from one end of the installing board 2412c, a protruding portion 242c can extend from the first board 2411c, a linking board 2413c can extend upward from the other end of the installing board 2412c. A second board 2414c can extend from the linking board 2413c and a latching portion 243c can extend from the second board 2414c. The first board 2411c can be parallel to the second board 2414c and the installing board 2412c can be arranged at an angle with the linking board 2413c. A plurality of air intakes 2415c can be defined on the installing board 2412c parallel to each other. A plurality of installing holes 2416c can be defined on the installing board 2412c.

In the illustrated embodiment, the fan 40 can be a centrifugal fan. The fan 40 can be arranged on a lower surface of the installing board 2412c and can be fixed to the installing hole 2416c with screws.

Figure 14:
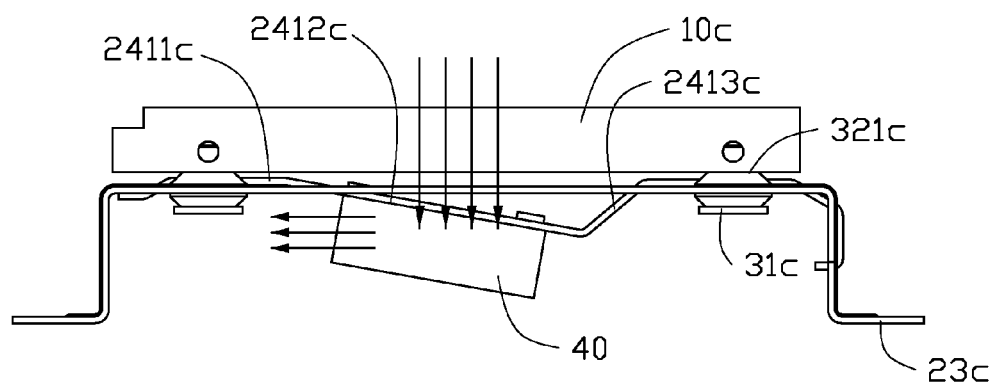
FIG. 14 is a second isometric view of the hard disk frame of FIG. 11 viewed from another angle.

FIG. 14 illustrates that cold air from outside can enter the fan 40 through the air intakes 2415c and can radiate from a side, and dissipate the heat generated by the heat generating elements.

In other embodiments, the main body 241c can be a rectangular plate and the plurality of air intakes 2415c can be arranged on a lower surface of the rectangular plate. In other embodiments, the main body 241c can include an installing board 2412c inclining downward from the main body 241c and a linking board 2413c inclining upward from the installing board 2412c. That is, the main body 241c does not include the first board 2411c and the second board 2414c.

Although various features and elements are described as embodiments in particular combinations, each feature or element can be used alone or in other various combinations within the principles of the present disclosure to the full extent indicated by the broad general meaning of the terms in which the appended claims are expressed.

What is claimed is:

1. A hard disk frame, for holding a hard disk drive, comprising:
    a supporting plate, the supporting plate defining a first opening;
    a first group of positioning portions; and
    a second group of positioning portions;
    wherein each of the first and the second group of the positioning portions defines a second opening, the second openings communicate with the first opening; the first group of the positioning portions enable the hard disk drive to be mounted to the supporting plate at a first direction, and a second group of the positioning portions enable the hard disk drive to be mounted to the supporting plate in a second direction different from the first direction.

2. The hard disk frame of claim 1, wherein the first direction is perpendicular to the second direction.

3. The hard disk frame of claim 1, wherein the supporting plate comprises a pair of first side panels opposite to each other, a pair of second side panels perpendicular to the first side panels, the first side panels and the second side panels are located end-to-end to form the first opening.

4. The hard disk frame of claim 3, wherein the supporting plate is a frame comprising four supporting legs, and the supporting legs extend downwardly from the first side panels to support for the supporting plate.

5. The hard disk frame of claim 4, further comprising an accessory fixed to the supporting plate, the accessory comprising a protruding portion, a latching portion, and a hook bent downwardly from the latching portion, the protruding portion and the hook being inserted into the first side panels and the second side panels to fix to the supporting plate.

6. The hard disk frame of claim 5, wherein one of the first side panels defines a first latching hole, the other one of the first side panels defines a second latching hole, and the protruding portion is passed through the first latching hole and the hook is inserted into the second latching hole to make the accessory coplanar with the supporting plate.

7. The hard disk frame of claim 5, wherein the accessory further comprises a radiating portion, the radiating portion is concaved from a center of the accessory and contacts to heat generating elements of the electronic device for dissipating the heat generated by the heat generating elements.

8. The hard disk frame of claim 4, further comprising a plurality of ribs, two ribs are located at each of the four corners of the hard disk frame and each of the ribs respectively extends from the first side panel to the supporting leg.

9. The hard disk frame of claim 8, furthering comprising a plurality of buffering elements, wherein the plurality of buffering elements are inserted into the hard disk drive.

10. The hard disk frame of claim 9, wherein when the hard disk drive is secured to the supporting plate along the first direction, the buffering element is latched with the first group of positioning portions; when the hard disk drive is secured to the supporting plate along the second direction, the buffering element is latched with the second group of positioning portions.

11. A hard disk frame, for holding a hard disk drive, comprising:
    a supporting plate, the supporting plate defining a first opening;
    a first group of positioning portions; and
    an accessory, detachably connected to the supporting plate, the accessory comprising a third group of positioning portions;
    wherein the third group of positioning portions enables the hard disk drive in a first size to be mounted to the supporting plate when the accessory is connected to the supporting plate; the first group of positioning portions enables the hard disk drive in a second size different from the first side to be mounted to the supporting plate at the first direction when the accessory is detached from the supporting plate.

12. The hard disk frame of claim 11, wherein the first group of positioning portions is defined on corners of two first side panels opposite to each other, the third group of positioning portions is extended upwardly from the accessory and located above two second side panels, the first side panel is perpendicular to the second side panel, and the first side panels and the second side panels are located end-to-end.

13. The hard disk frame of claim 12, wherein one of the first side panels defines a first latching hole, the other one of the first side panels defines a second latching hole, the first latching hole and the second latching hole are arranged to engage with the accessory.

14. The hard disk frame of claim 13, wherein the accessory comprises a protruding portion, a latching portion and a hook is bent downwardly from the latching portion, and the protruding portion is passed through the first latching hole and the hook is inserted into the second latching hole to make the accessory coplanar with the supporting plate.

15. The hard disk frame of claim 14, furthering comprising a plurality of buffering elements, wherein the plurality of buffering element is inserted into the hard disk drive.

16. The hard disk frame of claim 15, wherein when the hard disk drive in the first size is secured to the accessory, the buffering element is latched with the third group of positioning portions; when the hard disk drive in the second size is secured to the supporting plate and the accessory is detached from the supporting plate, the buffering element is latched with the first group of positioning portions.

17. An electronic device, comprising:
    a supporting plate;
    a first group of the positioning portions;
    a second group of the positioning portions;
    a hard disk drive fixed to the supporting plate, the hard disk drive comprising a group of position holes, the first group of positioning portions corresponding with the position holes when the hard disk drive is placed in a first direction; the second group of positioning portions corresponding with the position holes when the hard disk drive is placed in a second direction different from the first direction; and
    a connecting element to connect the position holes to the first position portions or the second position portion for arranging the hard disk drive on the supporting plate in the first direction or second direction.

18. The electronic device of claim 17, furthering comprising an accessory fixed to the supporting plate, wherein the accessory comprises a main body, an installing board inclines downwardly from the main body, a protruding portion extends from the installing board, a linking board inclines upwardly from the installing board, a latching portion extends from the linking board, and the protruding portion and the latching portion engage with the supporting plate and are held by the supporting plate.

19. The electronic device of claim 18, wherein the supporting plate comprises a first latching hole and a second latching hole, the protruding portion is passed through the first latching hole and the hole is inserted into the second latching hole to make the accessory coplanar with the supporting plate.

20. The electronic device of claim 19, wherein the accessory further comprises a fan mounted on the installing board, a plurality of air intakes defined on the installing board, and cold air from outside enters the fan through the air intakes and radiates from a side of dissipating the heat generated by heat generating elements.

* * * * *